(12) United States Patent
Maurice et al.

(10) Patent No.: US 7,217,639 B2
(45) Date of Patent: May 15, 2007

(54) METHOD OF MANUFACTURING A MATERIAL COMPOUND WAFER

(75) Inventors: Thibaut Maurice, Grenoble (FR); Eric Guiot, Goncelin (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 225 days.

(21) Appl. No.: 11/004,408

(22) Filed: Dec. 3, 2004

(65) Prior Publication Data
US 2005/0277269 A1    Dec. 15, 2005

(30) Foreign Application Priority Data
Jun. 11, 2004   (EP) ................... 04291472

(51) Int. Cl.
*H01L 21/46* (2006.01)
*H01L 21/30* (2006.01)

(52) U.S. Cl. ............................. 438/458; 257/E21.568
(58) Field of Classification Search ................ 438/458; 257/E21.568
See application file for complete search history.

(56) References Cited

U.S. PATENT DOCUMENTS

| 5,877,070 | A | 3/1999 | Goesele et al. ............. 438/458 |
| 6,303,468 | B1 | 10/2001 | Aspar et al. ................. 438/455 |
| 6,486,041 | B2 * | 11/2002 | Henley et al. ............... 438/458 |

FOREIGN PATENT DOCUMENTS

FR    2 767 416 A    2/1999

JP    09213652    8/1997

OTHER PUBLICATIONS

Lagahe C. et al., XP010563634, "A Parallel Between Silicon Spliffing Kinetics Study and IR Absorption Analysis", 2001 IEEE International SOI Conference, pp. 69-70 (2001).
Aspar B., et al., XP-001050558, "The Generic Nature of the Smart-Cut® Process for Thin Film Transfer", Journal of Electronic Materials, vol. 30, No. 7, pp. 834-840 (2001).

(Continued)

*Primary Examiner*—Asok Kumar Sarkar
(74) *Attorney, Agent, or Firm*—Winston & Strawn LLP

(57) ABSTRACT

The invention relates to a method for manufacturing a material compound wafer by forming a predetermined splitting area in a source substrate; attaching the source substrate to a handle substrate to form an assembly; heating the assembly for weakening the predetermined splitting area; and determining a degree of weakening of the predetermined splitting area which evidences the physical strength of the predetermined splitting area during or after heating to detect anomalies that may lead to damage of the source substrate, handle or assembly. The degree of weakening is advantageously determined in-situ and may be determined continuously or periodically during the heating. The invention further relates to an apparatus for thermal annealing device used in the manufacturing process of a material compound wafer. This apparatus generally includes a device for thermally annealing the assembly described above; and a device for determining the degree of weakening of the predetermined splitting area during or after thermal annealing to detect anomalies that may lead to damage of the source substrate, handle or assembly.

21 Claims, 2 Drawing Sheets

OTHER PUBLICATIONS

Maleville C., et al., "Wafer Bonding and H-implantation Mechanisms Involved in the Smart-Cut® Technology", Materials Science and Engineering, vol. 46, pp. 14-19 (1997).

Aspar B., et al., XP-000884906, "Smart-Cut® Technology: An Industrial Application of Ion Implantation Induced Cavities", Materials Research Society Symposium Proceedings, Materials Research Society, vol. 510, pp. 381-393 (1998).

Aspar B. et al., "The Generic Nature of the SMART-CUT® Process for Thin Film Transfer", Jan. 22, 2001, Journal of Electronic Materials, pp. 836-837.

\* cited by examiner

METHOD OF MANUFACTURING A MATERIAL COMPOUND WAFER

FIELD OF THE INVENTION

The invention relates to a method for manufacturing material compound semiconductor wafers that includes the steps of forming a predetermined splitting area in a source substrate, attaching the source substrate to a handle substrate to form an assembly, heating, such as thermal annealing, of the assembly for weakening the predetermined splitting area and determining a degree of weakening of the predetermined splitting area which evidences the physical strength of the predetermined splitting area during or after heating to detect anomalies that may lead to damage of the source substrate, handle or assembly.

BACKGROUND OF THE INVENTION

The use of material compound wafers, for example silicon on insulator ("SOI") or silicon on quartz ("SOQ") wafers, has become more and more widespread in the manufacturing process of modern electronic, optoelectronic, or micromechanical devices. Therein, use is made of the different physical or chemical properties of at least two materials that are attached together in such a structure. For example, in the case of an SOQ wafer, a thin silicon layer is provided on a quartz plate so that in an optoelectronic application, electronic circuits can be developed in and on the semiconducting silicon layer and at the same time, the quartz substrate can be used as the cover of the electronic device through which light can enter or exit the device.

To make such material compound wafers not only technologically interesting, but also economically viable, it becomes necessary to provide a manufacturing process of these material compound wafers that is capable of producing high quality material compound wafers, like the SOQ wafers, which are also economically viable.

In the case of SOI wafers, one example of such a suitable manufacturing process is based on SMART CUT® technology, which comprises the following process steps: implanting atomic species in a source substrate thereby forming an in-depth weakened layer corresponding to a predetermined splitting area, then bonding the source substrate to a handle substrate to form an assembly, and finally performing a splitting or detachment step, which is achieved by providing thermal or mechanical energy to the assembly, whereby the splitting occurs along the weakened area or implanted ions. The result of this process is that a thin layer from the source substrate is transferred onto the handle substrate. Usually a final treatment takes place to obtain a surface quality suitable for the desired application.

It is known that with raising temperature, such as by heating, the implanted layer becomes weaker and weaker, wherein the strength of the bonding interface gets stronger so that the transfer of the thin layer onto the handle substrate becomes possible after a certain temperature is achieved. Cho, Y., Cheung, N. W. "Low Temperature Si Layer Transfer by Direct Bonding and Mechanical Ion Cut" Appl. Phys. Lett. vol. 83, no. 18 (Nov. 3, 2003). In this reference, forces were measured with a probe destructive method by introducing a razor blade into the bonded structure to achieve a detachment either at the bonding interface or at the implanted layer. From this, an estimate was made of the necessary surface energy, which is related to the strength of the bonding interface and the implanted layer.

In the case of hetero-structures, and more particularly in the case of hetero-structures composed of materials having different characteristics, e.g., different thermal expansion coefficients, the above mentioned splitting step is usually carried out in two separate steps. First, an annealing step is used to further weaken the predetermined splitting area, and then a detachment step is used during which either thermal or mechanical energy is provided to the weakened area to achieve the actual detachment of the two structures. This two-step process is necessary due to the different thermal expansion coefficients of the materials, and the mechanical stresses that occur in the assembly. These factors ultimately lead to a reduction of production yield, as the heterostructure may break due the internal stress at an elevated temperature.

However, with the economical pressure on the prices of wafers being extremely high, the production yield for the production of material compound wafers, particularly for heterogeneous material compound wafers, is not sufficient with the above described method.

Thus, the present invention now provides a manufacturing method and apparatus for facilitating splitting of such material compound wafers, in particular heterogeneous material compound wafers, and for which the production yield and quality of the final product is further enhanced.

SUMMARY OF THE INVENTION

The present invention now provides a method for manufacturing a material compound wafer which comprises forming a predetermined splitting area in a source substrate; attaching the source substrate to a handle substrate to form an assembly; heating the assembly for weakening the predetermined splitting area; and determining a degree of weakening of the predetermined splitting area which evidences the physical strength of the predetermined splitting area during or after heating to detect anomalies that may lead to damage of the source substrate, handle or assembly. The degree of weakening is advantageously determined in-situ and may be determined continuously or periodically during the heating.

The heating is generally a thermal annealing treatment that is applied to the assembly to weaken the predetermined splitting area but that is insufficient to cause complete detachment in the splitting area. The heating should be terminated when the degree of weakening attains a predetermined value, and preferably this is performed automatically. For optimum results, the degree of weakening should be measured more than once during the heating, and one or both of heating temperature or heating time is adjusted depending on the measured degree of weakening of the predetermined splitting area.

The degree of weakening may be determined a number of ways. For example, it can be determined by measuring an optical property of the predetermined splitting area. The optical property can be measured in a visible light range, an x-ray range or an infrared light range, as desired. The degree of weakening can also be determined by comparing the measured optical property of the predetermined splitting area during or after the heating with an optical property of the predetermined splitting area that is measured prior to the heating. It also can be determined by measuring a reflectivity or transmission value of the assembly using a single wavelength or a predetermined range of wavelengths, e.g., those wavelengths ranging from about 400 nm to about 1600 nm.

Also, when the handle is transparent, the degree of weakening can be determined by performing measurements through the handle.

The invention also relates to an apparatus for thermal annealing used in a manufacturing process of a material compound wafer for weakening a source substrate at a predetermined splitting area. This apparatus comprises a device for thermally annealing an assembly of a handle attached to a source substrate that includes a predetermined splitting area; and a device for determining a degree of weakening which evidences the physical strength of the predetermined splitting area during or after thermal annealing to detect anomalies that may lead to damage of the source substrate, handle or assembly.

Preferred devices for determining the degree of weakening include a reflectometer or an ellipsometer. Also, the apparatus preferably includes a control device for repetitively determining the degree of weakening during the thermal annealing, and for adjusting the thermal annealing based on the determined degree of weakening. Optimally, the control device continuously analyzes the degree of weakening, and then adjusts the thermal annealing by varying temperature or duration of heating.

The material compound used in the method and that is annealed by the apparatus is generally a heterogeneous material compound, and preferably one that comprises at least two materials having different physical or chemical properties. Generally, such materials have different thermal expansion coefficients.

Specific embodiments of the present invention will become more apparent from the following detailed description with reference to the accompanying drawings.

BRIEF DESCRIPTION OF THE DRAWINGS

FIG. 1a shows a source substrate;

FIG. 1b shows a handle substrate;

FIG. 1c shows the source substrate of FIG. 1a after implantation of atomic species;

FIG. 1d shows the source substrate of FIG. 1c after bonding with the handle substrate;

FIG. 1e shows the assembly of FIG. 1d after illumination by a light beam;

FIG. 1f shows the assembly of FIG. 1e after thermal annealing;

FIG. 1g shows the assembly of FIG. 1f after application of energy to the predetermined splitting area;

DETAILED DESCRIPTION OF THE PREFERRED EMBODIMENTS

Figure 1:
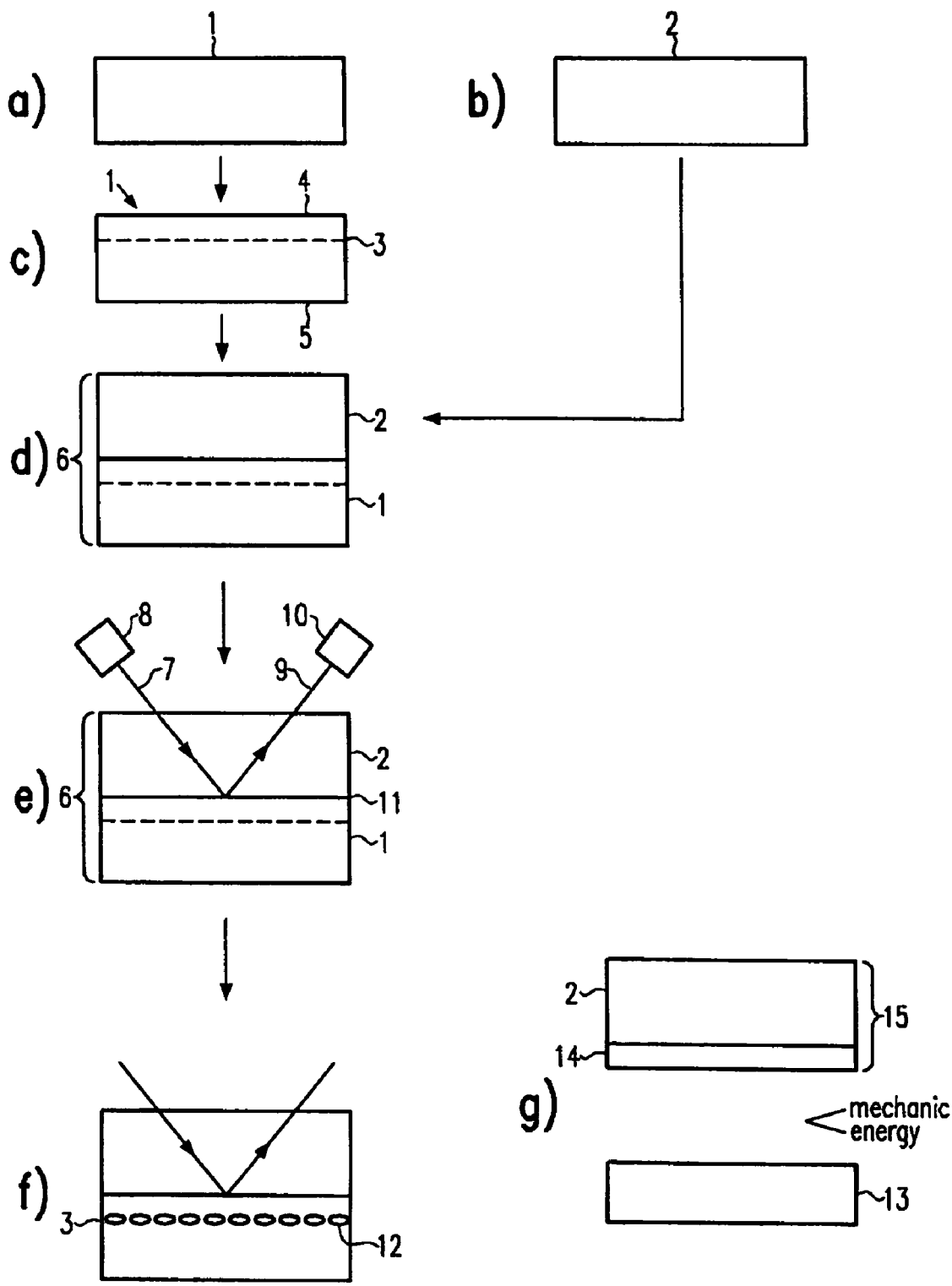
FIG. 1 schematically shows a process sequence according to an embodiment of the method for manufacturing a material compound wafer.

The preferred embodiment of the invention is a method for manufacturing a material compound wafer in which a thermal annealing device is used to determine a degree of weakening within the wafer.

Surprisingly, by determining the degree of weakening of the source substrate, the operator carrying out the manufacturing method is supplied with additional data about the status of the maturity of the weakening. The term "weakening" herein describes the physical strength of the connection between the two parts of the source substrate which are to be detached at the predetermined splitting area. For example, in the case of SMART CUT® technology, the weakening occurs due to the implantation of atomic species in the source substrate. The term "degree of weakening" in this application is employed as a measure of the strength of the weakened predetermined splitting area, when the two parts of the source substrate, with the splitting area therein between, are still connected to each other. Therefore, this term does not comprise the state when complete detachment between the two parts of the source substrate is achieved. In fact, the degree of weakening is determined prior to complete detachment.

According to a preferred embodiment, the degree of weakening can be determined in-situ during the heating of the assembly. For example, during the thermal annealing step, and more preferably during the entire thermal annealing step, the degree of weakening can be continuously measured. Such monitoring advantageously allows early detection of eventual anomalies in the weakening process so that eventual damage to the source substrate or the assembly can be prevented. Preferably, the thermal annealing step is carried out until complete detachment of the source substrate from the assembly is achieved. In another preferred embodiment, the annealing step is stopped prior to complete detachment whereby in a following process step, further energy is supplied to split the source substrate from the assembly.

Advantageously, the thermal annealing step can be terminated or stopped, and more preferably terminated or stopped automatically, when the degree of weakening corresponds to a predetermined value. By determining the degree of weakening, it is possible to control the thermal annealing step as a function of the actual weakening that occurs at the predetermined splitting area inside the assembly.

In a further advantageous embodiment, the degree of weakening can be determined more than once, and more preferably continuously or periodically, and depending on the evolution of the degree of weakening, the duration or the annealing temperature can be adjusted. This gives the advantage that an optimization of the thermal annealing process step can be achieved and leads to a better quality of the degree of weakening. This ultimately results in a better quality end product or a higher production yield.

According to an advantageous embodiment, the degree of weakening can be determined by measuring an optical property of the source substrate, preferably at the weakened predetermined splitting area. Measuring optical properties has the advantage that it is a non-destructive characterization technique and that, furthermore, no special preparation of the probe, in the case of a assembly, needs to be performed prior to carrying out the measurements. In addition, optical measuring equipment is relatively easy to install.

Preferably, the optical property can be measured in the visible light range or in the x-ray range, more preferably in the soft x-ray range, or in the infrared light range. The most suited electromagnetic wave spectrum can be chosen depending on the properties of the source substrate and the handle substrate. Measurement of optical properties in the visible light range is preferable for SOQ wafers, with the quartz being transparent, and has the added advantage that light sources and detectors are widely available and of relatively low cost. Infrared light can advantageously be employed with a silicon source substrate for measuring the weakening, preferably in the case of ultra thin SOI structures. Use of x-rays has the advantage that the probe does not have to be transparent.

In a further variant, the degree of weakening can be determined by measuring the reflectivity or the transmission of the assembly, preferably at the weakened predetermined splitting area. The measurement of reflectivity consists of irradiating the sample, e.g., an assembly, and measuring the light intensity that is reflected. By analyzing the measured reflectivity, insight is obtained on the physical properties of the irradiated material. In particular, use is made of the optical constants of the employed materials to characterize the probe. When using SMART CUT® technology, it is surprisingly possible to obtain information about the degree of weakening in the predetermined splitting area during thermal annealing. In addition to measuring reflectivity, it may also be possible to measure transmission, i.e., the light which is neither reflected nor absorbed while traveling through the assembly. Preferably, transmission measurements are suitable for a single wafer furnace and reflectivity measurements are suitable for batch systems.

Advantageously, the degree of weakening can be determined by comparing the measured optical property during or after thermal annealing with the measured optical property prior to thermal annealing. In particular, when the evolution of the degree of weakening is analyzed, the relative change of the optical property, for example reflectivity, which can be easily obtained by dividing the measured value by the value of the optical property prior to annealing, already gives insight into the evolution of the degree of weakening of the predetermined splitting area. In this embodiment, it is not necessary to determine the optical property on an absolute scale.

Further advantageously, reflectivity or transmission can be measured with one wavelength. This is easy to achieve by, for instance, using a solid state laser diode in the visible range. Furthermore, data analysis is also simplified when using only one wavelength.

In another variant, reflectivity or transmission can be measured in a predetermined range of wavelengths, preferably from about 400 nm to about 1600 nm for visible light, or from about 100 nm to about 3000 nm in the case of infrared light. Compared to measuring only a single wavelength, measurement of a whole spectrum of wavelengths gives more insight into the changes occurring in the predetermined splitting area during thermal annealing. Analyzing the reflectivity spectrum over a large range of wavelengths advantageously allows for quantification of the observed effects and better collecting of information about the maturity of the degree of weakening.

According to another advantageous embodiment, the handle substrate can be transparent and the degree of weakening can be determined by performing measurements through the handle substrate. As mentioned above, depending on the degree of weakening, the color of the source substrate, in particular the color of the surface of the source substrate which is close to the predetermined splitting area, is changing. As this surface is bonded to the handle substrate, it is advantageous, especially when using visible light, to employ a transparent handle substrate such that the measurements can be performed through the handle substrate. Thus, the method is particularly advantageous in the case of a quartz or glass handle substrate.

Another embodiment of the invention provides a thermal annealing device that is used in the manufacturing process of the material compound wafer for weakening the predetermined splitting area. The thermal annealing device further comprising a means for determining a degree of weakening and characterizing the physical strength of the weakened predetermined splitting area during or after thermal annealing. With the means of determining the degree of weakening, it thus becomes possible to obtain additional information about the state of the strength of the predetermined splitting area and better control the manufacturing process such that the end product has a better quality or the production yield becomes enhanced.

In another advantageous embodiment, the means for determining the degree of weakening comprises a reflectometer or an ellipsometer. Advantageously, the degree of weakening is determined by measuring reflectivity or transmission.

In a further variant, the thermal annealing device comprises a control means for analyzing the evolution of the degree of weakening, which can be measured several times, and preferably continuously. Based on the degree of weakening, the thermal annealing process can be adjusted, for example, by adjusting the annealing temperature or the annealing duration.

The invention also relates to an apparatus for determining the degree of weakening of the predetermined splitting area. Thus, the advantageous method can also be carried out in a standard thermal device which, according to the invention, which is equipped with a device for determining the degree of weakening.

FIGS. 1a–g illustrate one embodiment of the method for manufacturing a material compound wafer, for example an SOQ heterogeneous material compound wafer, according to SMART CUT® technology. The SOQ material compound wafer only represents one possible example of a material compound wafer, and other wafers, for example using materials of gallium nitride ("GaN"), silicon carbide ("SiC"), germanium on insulator ("GeOI"), silicon germanium ("SiGe") or SOI, can also be manufactured using the method as disclosed in the following.

FIG. 1a shows a source substrate 1. From this source substrate 1, a thin layer is eventually transferred to a handle substrate 2 shown in FIG. 1b. In the case of SOQ, the source substrate 1 is preferably a standard silicon wafer usually with a diameter of up to 300 mm and the handle substrate 2 is preferably a quartz wafer. Other possible wafer materials include, for example, III–V type wafers like gallium arsenide ("GaAs"), indium phosphite ("InP"), or gallium nitride ("GaN"), but also wafers made of germanium ("Ge") or fused silica. Wafers of any other suitable material generally known in the industry may also be used. The process can also be carried out with bare wafers, or one or more layers may be provided on one or both of the source substrate 1 or the handle substrate 2 prior to carrying out the inventive process. Such additional layers could be, for example, of a silicon dioxide layer, or of any other layer of suitable material generally known in the industry.

FIG. 1c depicts the next step in the process and includes implanting atomic species, preferably in an ionic state, such as for example hydrogen, helium or any other suitable rare gas generally known in the industry. In the case where hydrogen is used, the preferred energies are in the range of approximately 30 to 210 keV and the preferred range of implanting dose is about $5 \times 10^{15}$ to $1 \times 10^{17}$ atoms/cm$^2$ in order to form a predetermined splitting area 3 in the source substrate 1. This layer-like predetermined splitting area 3 lies inside the source substrate 1 and is essentially parallel to the main surfaces 4, 5 of the source substrate 1. The predetermined splitting area is at a distance from one of the main surfaces, for example main surface 4, depending on the energy of the atomic species and the material of the source substrate 1.

FIG. 1*d* illustrates the next step where the handle substrate 2 and the source substrate 1 are bonded together to form an assembly 6. One possible bonding mechanism is molecular bonding that takes place due to Van de Waals forces. In a subsequent annealing step, the strength of the bonding is enhanced. However, other suitable bonding techniques that are generally known in the industry can also be applied, depending on the substrate material selected.

In common methods of wafer manufacturing, the next process step usually consists of a thermal annealing step. In the preferred embodiment of the invention, however, a first reflectivity measurement is carried out prior to starting the thermal annealing step. As shown in FIG. 1*e*, the assembly 6 is illuminated with a light beam 7 which is produced by a light source 8 and travels through the transparent handle substrate 2 where it is reflected at the interface 11 between the handle substrate 2 and the source substrate 1. The reflected light 9 travels back through the handle substrate 2 and is captured by a detector 10.

The measurement of reflectivity can be performed according to several embodiments, examples of which are provided in the following. First, the light source 8 can be a light source having only one wavelength. Similarly, the light source can include a filter where all but one wavelength are filtered out such that only one wavelength impinges on the assembly 6. Here, the term "one wavelength" should be understood in the broad sense, meaning, for example a laser always has a certain wavelength range, which however is restricted compared to broad spectrum light sources. In another embodiment, the light source 8 can be a light source having a certain range of wavelengths, thus illuminating the assembly 6 with several wavelengths. The same principles apply with respect to the detector 10 which may be a detector only analyzing one particular wavelength, or could be a detector analyzing a range of wavelengths. In addition to the light source 8 and the detector 10, an entire arrangement of optical elements, such as lenses, filters, or other suitable elements, may also be employed in order to improve the measurement of reflectivity.

Reflectivity or transmission can be measured in a predetermined range of wavelengths, preferably from about 400 nm to 1600 nm for visible light, or preferably from about 100 nm to 3000 nm in the case of infrared light.

Additionally, reflectivity can be measured by illuminating the entire interface 11 and analyzing the reflected light from the entire interface. Similarly, only a part of the 11 may be irradiated and the reflected light from that irradiated part of the interface be analyzed. Furthermore, it is also possible to irradiate several parts of the interface 11 at different positions and analyze the reflected light from all of those different positions. This can be performed either by providing several light sources in parallel together with several detectors in parallel, or by subsequently measuring different positions by providing a moveable mirror system in the optical path such that the position where the light impinges on the interface 11 can be moved from one location to another.

Typical light sources suitable for this application comprise single wavelength light sources, for example laser diodes, or light sources capable of providing a wider range of wavelengths. Suitable detectors can also be selected corresponding to the type of light source used.

The next step in the process may include the thermal annealing step for weakening the source substrate 1 at the predetermined splitting area 3. This step is preferably carried out at a temperature in a range of about 200° C. to 500° C., and lasts from about a couple of minutes to a couple of hours. These temperature and time ranges, however, may vary depending on the given material, the nature of the implanted species, and the energy and dose that is applied. Due to the fact that the hetero-structure, for example SOQ, is made out of two different materials, preferably having different thermal expansion coefficients, it happens that during the thermal annealing step, the silicon tends to expand much more than the quartz, leading to stress inside the assembly. While the thermal energy helps to weaken the predetermined splitting area, the stress inside the assembly 6 causes additional undesired damaging to the structure itself. The inventive method surprisingly prevents such undesired damaging by determining the degree of weakening and characterizing the physical strength of the weakened predetermined splitting area during or after the thermal annealing step. This degree of weakening being known, the thermal annealing step can be terminated prior to the occurrence of undesired breaking or damaging of the assembly due to internal stress.

FIG. 1*f* shows a preferred embodiment of the invention where the degree of weakening is obtained by measuring reflectivity during the thermal annealing step. The manner in which the reflectivity spectrum is measured is analogous to the method previously described with respect to FIG. 1*e*. The reflectivity spectrum obtained during the thermal annealing step can then be compared to the reflectivity spectrum measured prior to the thermal annealing step or alternatively compared to a predetermined reference spectrum.

In another embodiment, the data obtained from the reflectivity measurements can be used to identify when the thermal annealing step should be stopped to avoid damage to the assembly. This is preferably performed automatically by comparing the obtained degree of weakening with a predetermined value. If, for example, reflectivity is measured with only one wavelength and the degree of weakening is obtained by dividing the measured intensity during thermal annealing by the measured intensity value prior to thermal annealing, it may be decided to stop the annealing step when this value reaches a certain critical value, like e.g. 75%.

In yet another embodiment, it is preferable to use the evolution of the degree of weakening to control the thermal annealing step by adjusting the temperature and the duration of the annealing.

FIG. 1*g* illustrates the next process step where a portion of the source substrate 13 is detached from the handle substrate 2 on which a thin layer 14 of the original source substrate 1 is attached to create the SOQ material compound wafer 15. To achieve the detachment, energy is applied at the position of the predetermined splitting area, preferably by introducing a blade at such area. Eventually, final detachment may also be achieved by a further thermal annealing step.

Following the detachment of the SOQ structure from the portion of the source substrate 13, a further surface treatment may be carried out to provide a SOQ material compound wafer 15 with desired surface properties.

In the described embodiment, reflectivity is determined as a measure of the degree of weakening. Other optical measurements, however, are also suitable to determine quantitative or qualitative values for the degree of weakening. For example, transmission may be also measured, preferably in the case when both the source substrate and the handle substrate are transparent.

Another embodiment uses infrared light or x-rays to obtain the necessary information concerning the maturity or propagation of the cavities. Of particular interest therein is the manufacturing process of ultra thin SOI structures wherein a determination of the degree of weakening is important due to the thin silicon layer. In such instances, the source and handle substrates are not transparent in the visible regime, and it would be advantageous to use infrared light or x-rays to obtain the degree of weakening information.

The abovementioned process has been explained using the SMART CUT® technology to manufacture SOQ wafers. The invention, however, may also be employed in any other process generally known in the industry that is capable of manufacturing material compound wafers. For example, the weakened layer of the predetermined splitting area can be obtained by providing or forming a porous layer in the source substrate according to known techniques. The remainder of the process is conducted as described herein.

Figure 2:
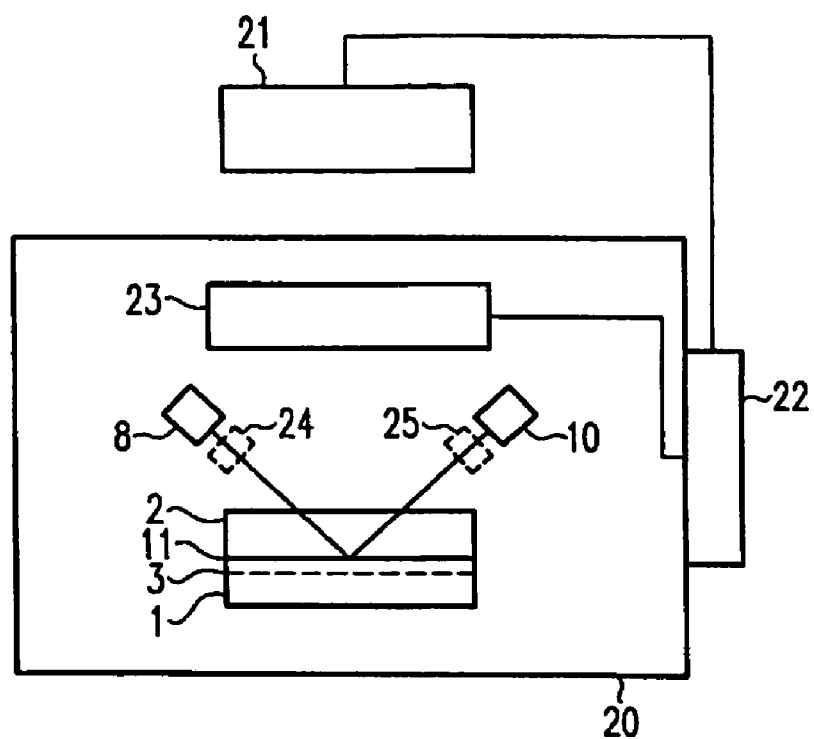
FIG. 2 shows an embodiment of the inventive thermal annealing device.

FIG. 2 illustrates an embodiment of the thermal annealing device 20 used in the abovementioned manufacturing process of a material compound wafer 15. The thermal annealing device is used for weakening the source substrate 1 at the predetermined splitting area 3. Elements having the same reference numerals in FIGS. 1a–g and 2 correspond to the same elements and therefore have the same characteristics. The thermal annealing device 20 is, for example, based on a standard oven used for thermal annealing and further comprises a means for determining the degree of weakening of the weakened predetermined splitting area 3. In a preferred embodiment for determining the degree of weakening, a light source 8 and a detector 10 are provided having the same features and properties as the ones explained with respect to FIG. 1e.

The light source 8 and the detector 10 are linked to an analyzing means 21, which computes the degree of weakening and may output the results to the operator, e.g. in a graphical manner. In a further variant of the invention, the analyzing means 21 may be connected to the control means 22 of the thermal annealing device to automatically provide the control means 22 with instructions to change the temperature of the heating element 23 or to provide a signal to stop the annealing process. Instead of a reflectometer, an ellipsometer may also be employed to determine the degree of weakening. Thereto, a polarizer 24 is placed after the light source 8 and an analyzer 25 is placed before of the detector 10.

Figure 3:
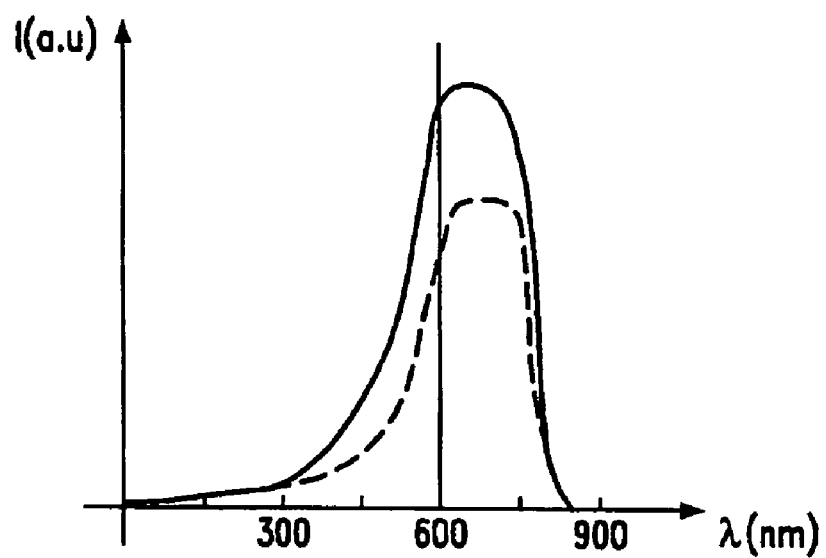
FIG. 3 shows an example of a reflectivity spectrum measured prior to thermal annealing and during thermal annealing, and which shows the change in reflectivity which is characteristic for the evolution of the degree of weakness in the case of a SOQ wafer.

FIG. 3 shows an example of a reflectivity spectrum of a SOQ wafer obtained in the manner described with respect to FIGS. 1e–f. In this example, implantation occurred at a rate of $6 \times 10^{16}$ atoms/m² with ions of an energy of 52 keV. The y axis corresponds to the measured intensity (in arbitrary units) and the x axis corresponds to the wavelength (in nanometers). The solid line indicates the measured reflectivity as a function of wavelength prior to the thermal annealing step, and the dotted line shows the change in reflectivity occurring during the thermal annealing step (after about 4.5 hours at a temperature of 390° C.). In this example, a range of wavelengths was reflected. However, as indicated by the solid line at about 600 nm, information concerning the degree of weakening can also be obtained from a single wavelength measurement, namely the degree of weakening can be defined as the ratio between the intensity at about 600 nm during thermal annealing and the intensity at about 600 nm prior to thermal annealing.

While illustrative embodiments of the invention are disclosed herein, it will be appreciated that numerous modifications and other embodiments may be devised by those skilled in the art. Therefore, it is understood that the appended claims are intended to cover all such modifications and the embodiments that come within the spirit and scope of the present invention.

What is claimed is:

1. A method of manufacturing a material compound wafer which comprises:
    forming a predetermined splitting area in a source substrate;
    attaching the source substrate to a handle substrate to form an assembly;
    heating the assembly for weakening the predetermined splitting area; and
    determining a degree of weakening of the predetermined splitting area which evidences the physical strength of the predetermined splitting area during or after heating to detect anomalies that may lead to damage of the source substrate, handle or assembly,
    wherein the degree of weakening is measured more than once during the heating, and one or both of heating temperature or heating time is adjusted depending on the measured degree of weakening of the predetermined splitting area to avoid damaging the source substrate, handle or assembly during subsequent detachment at the splitting area.

2. The method of claim 1, wherein the degree of weakening is determined in-situ.

3. The method of claim 1, wherein the degree of weakening is determined continuously or periodically during the heating.

4. The method of claim 1, wherein the heating is a thermal annealing treatment that is applied to the assembly to weaken the predetermined splitting area but that is insufficient to cause complete detachment in the splitting area.

5. The method of claim 1, wherein the material compound is a heterogeneous material compound comprising at least two materials with different physical or chemical properties.

6. The method of claim 5, wherein the at least two materials have different thermal expansion coefficients.

7. The method of claim 1, wherein the heating is terminated when the degree of weakening attains a predetermined value.

8. The method of claim 7, wherein heating is automatically terminated when the degree of weakening attains the predetermined value.

9. The method of claim 1, wherein the degree of weakening is determined by measuring an optical property of the predetermined splitting area.

10. The method of claim 9, wherein the optical property is measured in a visible light range, an x-ray range or an infrared light range.

11. The method of claim 9, wherein the degree of weakening is determined by comparing the measured optical property of the predetermined splitting area during or after the heating with an optical property of the predetermined splitting area that is measured prior to the heating.

12. The method of claim 1, wherein the degree of weakening is determined by measuring a reflectivity or transmission value of the assembly.

13. The method of claim 12, wherein the reflectivity or transmission value is measured with a single wavelength or with a predetermined range of wavelengths.

14. The method of claim 13, wherein the reflectivity or transmission value is measured with a predetermined range of wavelengths ranging from about 400 nm to about 1600 nm.

15. The method of claim 1, wherein the handle is transparent and the degree of weakening is determined by performing measurements through the handle.

16. The method of claim 1, conducted in an apparatus comprising an annealing device for thermally annealing the assembly; and a device for determining the degree of weakening of the predetermined splitting area.

17. The method of claim 16, wherein the device for determining the degree of weakening comprises a reflectometer.

18. The method of claim 16, wherein the device for determining the degree of weakening comprises an ellipsometer.

19. The method of claim 16, further comprising a control device for repetitively determining the degree of weakening during the thermal annealing, and for adjusting the thermal annealing based on the determined degree of weakening.

20. The method of claim 19, wherein the control device continuously analyzes the degree of weakening.

21. The method of claim 19, wherein the control device adjusts the thermal annealing by varying temperature or duration of heating.

* * * * *